(12) United States Patent
Matsui et al.

(10) Patent No.: US 7,888,139 B2
(45) Date of Patent: Feb. 15, 2011

(54) FABRICATING METHOD OF NONVOLATILE SEMICONDUCTOR STORAGE APPARATUS

(75) Inventors: Yukiteru Matsui, Kanagawa (JP);
Takeo Kubota, Kanagawa (JP);
Yoshikuni Tateyama, Kanagawa (JP);
Hiroyuki Kanaya, Kanagawa (JP);
Yoshihiro Minami, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/549,261

(22) Filed: Aug. 27, 2009

(65) Prior Publication Data
US 2010/0144062 A1    Jun. 10, 2010

(30) Foreign Application Priority Data
Dec. 4, 2008  (JP) ............... 2008-309634

(51) Int. Cl.
*H01L 21/00* (2006.01)
(52) U.S. Cl. ............... 438/3; 438/239; 438/692; 257/E21.663
(58) Field of Classification Search ............ 438/3, 438/239, 240, 253, 692, 693, 691
See application file for complete search history.

(56) References Cited

U.S. PATENT DOCUMENTS

| 6,245,650 | B1 * | 6/2001 | Watanabe ............... 438/580 |
| 6,444,583 | B2 * | 9/2002 | Aoki ............... 438/692 |
| 2005/0272171 | A1 * | 12/2005 | Nakayama et al. ............... 438/3 |
| 2008/0020490 | A1 * | 1/2008 | Kitahara et al. ............... 438/3 |

FOREIGN PATENT DOCUMENTS

| JP | 2006-032734 | 2/2006 |
| JP | 2006-245333 | 9/2006 |
| JP | 2007-109718 | 4/2007 |
| JP | 2008-159924 | 7/2008 |
| WO | WO 2004/093193 A1 | 10/2004 |

* cited by examiner

*Primary Examiner*—Charles D Garber
*Assistant Examiner*—Reema Patel
(74) *Attorney, Agent, or Firm*—Finnegan, Henderson, Farabow, Garrett & Dunner, L.L.P.

(57) ABSTRACT

A first electrode film, a ferroelectric film, and a second electrode film are accumulated above a semiconductor in this order, a hard mask is accumulated above the second electrode, scrub cleaning is performed on the surface of the hard mask with an surfactant, the hard mask on which the scrub cleaning is performed has been patterned according to a planar shape of a ferroelectric capacitor, and etching is performed by using as a hard mask the hard mask that has been patterned.

14 Claims, 9 Drawing Sheets

FABRICATING METHOD OF NONVOLATILE SEMICONDUCTOR STORAGE APPARATUS

CROSS-REFERENCE TO RELATED APPLICATIONS

This application is based upon and claims the benefit of priority from the prior Japanese Patent Application No. 2008-309634, filed on Dec. 4, 2008; the entire contents of which are incorporated herein by reference.

BACKGROUND OF THE INVENTION

1. Field of the Invention

The present invention relates to a fabricating method of a nonvolatile semiconductor storage apparatus, and more particularly, is preferably applied to a method in which dust on a hard mask used in etching a ferroelectric film can be reduced.

2. Description of the Related Art

Some of the nonvolatile semiconductor storage apparatuses are ferroelectric memories in which ferroelectric substance such as lead zirconate titanate (PZT:$Pb(Zr,Ti)O_3$) and tantalic acid strontium bismuth (SBT:$SrBi_2Ta_2O_9$) is used as capacity insulating films.

Chemical stability of ferroelectric substance is high. Thus, processing of ferroelectric substance requires stronger physical etching element or enhanced reactivity. Therefore, when etching ferroelectric substance by using a resist mask, it is difficult to secure enough selection ratio between the ferroelectric substance and the resist mask. Thus, a hard mask made from substance such as aluminum oxide ($Al_2O_3$) is sometimes used as an etching mask.

In Japanese Patent Application Laid-open No. 2006-32734, a method is disclosed in which formation of a seam or a void in a hydrogen protective film, formation of an oxygen leak path formed in a hydrogen protective film, or reduction deterioration of a ferroelectric film due to being exposed to hydrogen atmosphere in a post process is prevented by planarizing a top electrode of a ferroelectric capacitor by employing chemical mechanical planarization (CMP).

Here, if there is dust on a hard mask that serves as an etching mask used in etching ferroelectric substance, the accuracy of the shape of the hard mask degrades in the area on which there is dust. Therefore, a shape defect may be caused to decrease a fabrication yield.

By the method disclosed in Japanese Patent Application Laid-open No. 2006-32734, a top electrode of a ferroelectric capacitor is planarized by employing CMP, and thus, dust on the top electrode can be removed. Dust on a hard mask used in etching ferroelectric substance, however, cannot be removed. Accordingly, the method disclosed therein has a problem that the shape defect cannot be reduced.

According to a method disclosed in Japanese Patent Application Laid-open No. 2008-159924, a hard mask formed from material such as TiN is formed on a first conductive film formed from $IrO_2$ via an alumina sacrificial film, an area on the first conductive film not covered by the hard mask is patterned, and then, the alumina sacrificial film is removed therefrom by performing a wet treatment. Thus, the hard mask is removed from the first conductive film pattern, and reattachment of residue, scum, or the like attached to the surface of the hard mask is prevented.

By the method disclosed in Japanese Patent Application Laid-open No. 2008-159924, however, wet treatment is performed on the alumina sacrificial film after patterning the first conductive film, and the first conductive film is etched with residue, scum, or the like attached to the surface of the hard mask. Therefore, shape defect of a pattern caused upon etching cannot be reduced.

BRIEF SUMMARY OF THE INVENTION

A fabricating method of a nonvolatile semiconductor storage apparatus according to an embodiment of the present invention comprises: accumulating a first electrode film, a ferroelectric film, and a second electrode film above a semiconductor substrate in this order; accumulating a hard mask above the second electrode film; performing scrub cleaning on a surface of the hard mask with an surfactant; patterning the hard mask on which scrub cleaning has been performed according to a planar shape of a ferroelectric capacitor; and forming the ferroelectric capacitor by performing etching by using as a mask the hard mask that has been patterned.

A fabricating method of a nonvolatile semiconductor storage apparatus according to an embodiment of the present invention comprises: accumulating a first electrode film, a ferroelectric film, and a second ferroelectric film above a semiconductor substrate in this order; accumulating a hard mask above the second electrode film; removing a superficial layer of the hard mask by employing chemical-mechanical polishing; patterning the hard mask on which the chemical-mechanical polishing has been performed according to a planar shape of a ferroelectric capacitor; and forming the ferroelectric capacitor by performing etching by using as a mask the hard mask that has been patterned.

DETAILED DESCRIPTION OF THE INVENTION

Exemplary embodiments of a fabricating method of a nonvolatile semiconductor storage apparatus according to the present invention are described in detail with reference to the accompanying drawings. The present invention is not, however, limited to the embodiments.

FIGS. 1 to 9 are sectional views of a fabricating method of a nonvolatile semiconductor storage apparatus according to an embodiment of the present invention.

Figure 1:
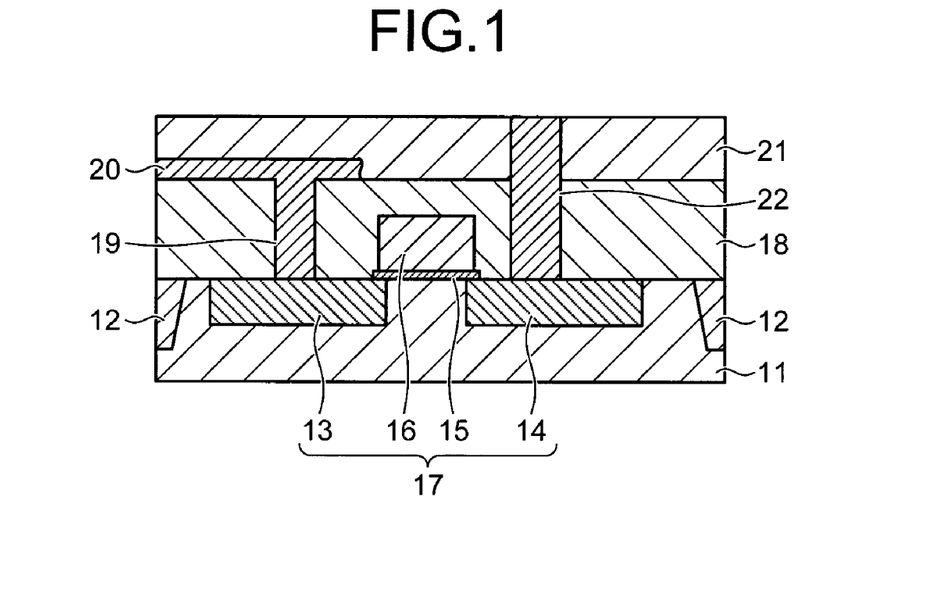
FIG. 1 is a sectional view of a fabricating method of a nonvolatile semiconductor storage apparatus according to an embodiment of the present invention.

In FIG. 1, trenches are formed on a semiconductor substrate 11 by employing photolithography and etching. Insulator such as a silicone oxide film is filled in the trenches, and thus, element isolation layers 12 are formed. Material used in the semiconductor substrate 11 is not limited to Si. The material may be selected from, for example, Ge, SiGe, SiC, SiSn, PbS, GaAs, InP, GaP, GaN, ZnSe, and GaInAsP. The element isolation layers 12 may have a local oxidation of silicon (LOCOS) structure as well as shallow trench isolation (STI) structure.

Then, a gate insulator 15 is formed on the semiconductor substrate 11 by employing a method such as thermal oxidation. A conductive material film such as a polycrystalline silicon film is formed on the gate insulator 15, and the conductive material film is patterned by employing photolithography and etching. Thus, a gate electrode 16 that also serves as a word line is formed on the gate insulator 15.

Then, impurity such as B, P, and As is ion-implanted in the semiconductor substrate 11 by using the gate electrode 16 as a mask, and impurity introduction layers 13 and 14 disposed at both sides of the gate electrode 16 are formed on the semiconductor substrate 11. Thus, a cell transistor 17 is formed.

An interlayer insulating film 18 that covers the gate electrode 16 is formed on the semiconductor substrate 11 by employing a method such as chemical vapor deposition (CVD).

Then, an opening that exposes the impurity introduction layer 13 is formed through the interlayer insulating film 18 by employing photolithography and etching. A conductive material film is formed on the interlayer insulating film 18 through which the opening is formed, and the conductive material film is patterned by employing photolithography and etching.

Thus, a bit line 20 that is connected to the impurity introduction layer 13 via an electrode 19 is formed on the interlayer insulating film 18.

Then, an interlayer insulating film 21 that covers the bit line 20 is formed on the semiconductor substrate 11 by employing a method such as CVD. Then, an opening that exposes the impurity introduction layer 14 is formed through the interlayer insulating films 18 and 21 by employing photolithography and etching. A conductive material film is formed on the interlayer insulating film 21 through which the opening is formed and the conductive material film formed on the interlayer insulating film 21 is removed by employing CMP. Thus, a plug electrode 22 connected to the impurity introduction layer 14 is formed through the interlayer insulating films 18 and 21. For example, the plug electrode 22 may be formed from tungsten.

Figure 2:
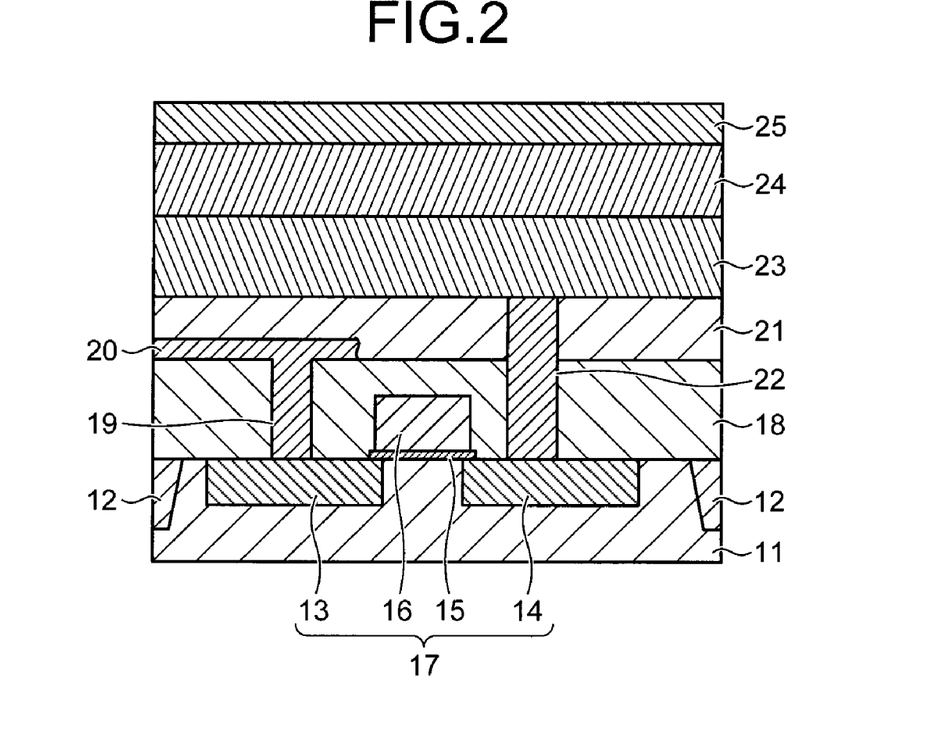
FIG. 2 is another sectional view of the fabricating method of the nonvolatile semiconductor storage apparatus according to the embodiment shown in FIG. 1.

As shown in FIG. 2, an electrode film 23 is accumulated on the interlayer insulating film 21 by employing a method such as sputtering. For example, the electrode film 23 may have laminated structure of a TiAlN film having the film thickness of about 30 nanometers and an Ir film having the film thickness of about 120 nanometers. Scrub cleaning may be performed on the electrode film 23 with an surfactant to reduce dust attached on the electrode film 23.

Then, a ferroelectric film 24 is accumulated on the electrode film 23 by employing a method such as metalorganic chemical vapor deposition (MOCVD), sputtering, and a sol-gel method. For example, the ferroelectric film 24 may be a PZT film having the film thickness of about 70 nanometers. To densify the ferroelectric film 24, heat treatment is preferably performed on the ferroelectric film 24 at the temperature of about 650 degrees centigrade in oxygen atmosphere after accumulating the ferroelectric film 24 on the electrode film 23.

An electrode film 25 is further accumulated on the ferroelectric film 24 by employing a method such as sputtering. The electrode film 25 may have laminated structure of a $SrRuO_3$ film having the film thickness of about 10 nanometers and an $IrO_2$ film having the film thickness of 70 nanometers. Scrub cleaning may be performed on the electrode film 25 with an surfactant to reduce dust attached on the electrode film 25.

Figure 3:
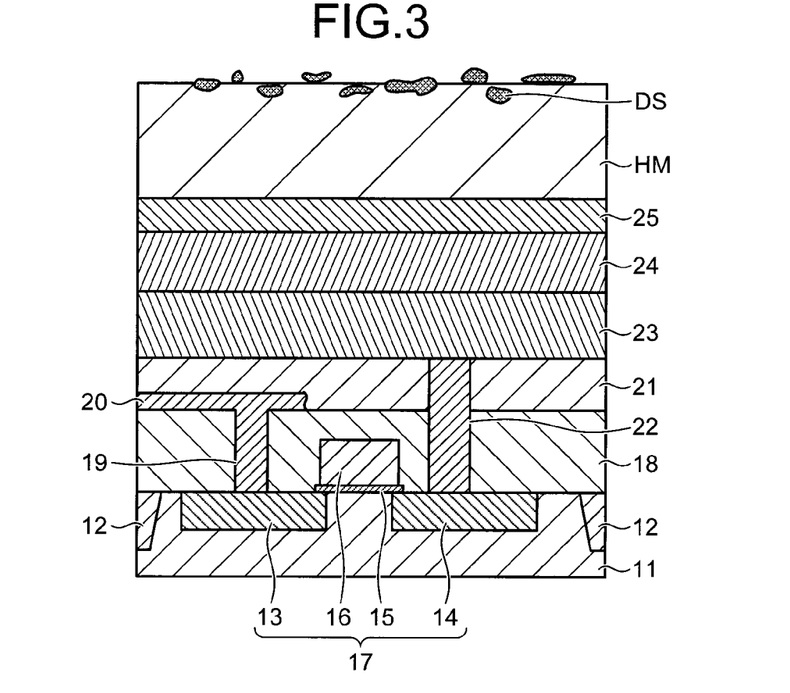
FIG. 3 is still another sectional view of the fabricating method of the nonvolatile semiconductor storage apparatus according to the embodiment shown in FIG. 1.

As shown in FIG. 3, a hard mask HM is accumulated on the electrode film 25 by employing a method such as sputtering. The hard mask HM may be formed from material such as $Al_2O_3$. The film thickness of the hard mask HM may be set to be about 130 nanometers from the viewpoint of etching resistance of the hard mask HM. Here, if the film thickness of the hard mask HM is set to be about 100 nanometers or more, dust DS at the time of film formation rapidly increases. The dust DS includes dust attached to the surface of the hard mask HM and dust embedded in the superficial layer thereof.

Figure 4:
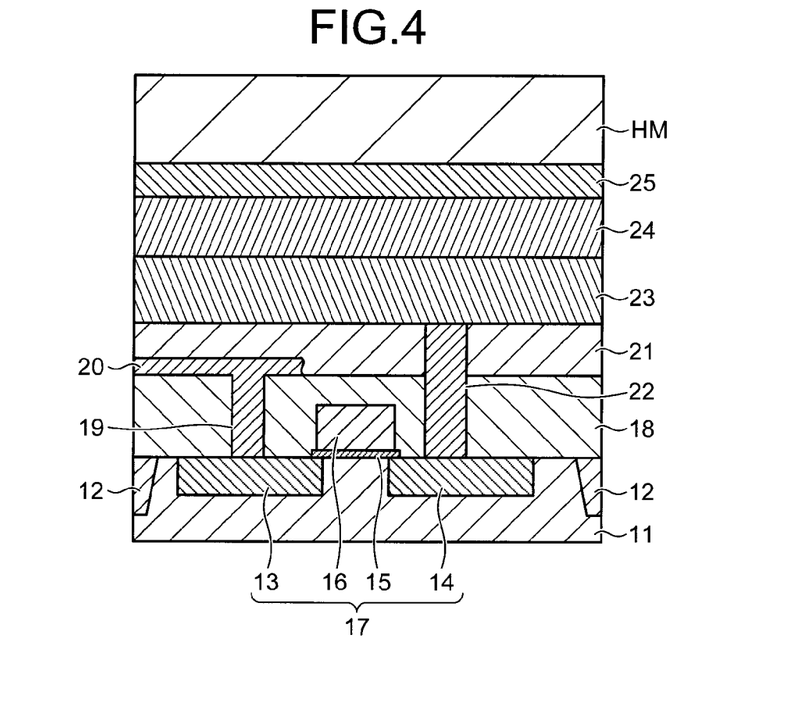
FIG. 4 is still another sectional view for showing the fabricating method of the nonvolatile semiconductor storage apparatus according to the embodiment shown in FIG. 1.

As shown in FIG. 4, the dust DS on the hard mask HM is reduced by performing scrub cleaning on the surface of the hard mask HM with an surfactant. When performing scrub cleaning on the surface of the hard mask HM, an anionic surfactant is preferably used as an surfactant.

When the hard mask HM is formed from $Al_2O_3$, the pH of an area near the isoelectric point of the zeta-potential represents neutral. By using an anionic surfactant as the surfactant, the zeta-potential of cleaning agent can be negative. Thus, the dust DS detached from the hard mask HM can be prevented from being reattached to the hard mask HM. Therefore, the dust DS on the hard mask HM can be efficiently reduced. The surfactant is not limited an to anionic surfactant. A cationic or a nonionic surfactant may be used as long as such surfactant increases the absolute value of the zeta-potential of the cleaning agent.

A superficial layer of the hard mask HM may be removed by performing chemical-mechanical polishing instead of performing scrub cleaning on the surface of the hard mask HM to reduce the dust DS on the hard mask HM. By performing the chemical-mechanical polishing, the dust embedded in a superficial layer of the hard mask HM can also be effectively reduced.

On the other hand, simply by cleaning the surface of the hard mask HM with pure water or alcohol, removing the dust DS therefrom is extremely difficult.

Alternatively, chemical-mechanical polishing of a superficial layer of the hard mask HM and scrub cleaning of the surface of the hard mask HM may both be performed to reduce the dust on the hard mask HM.

Polishing liquid used when performing chemical-mechanical polishing of a superficial layer of the hard mask HM is preferably controlled so that the pH thereof represents acid or alkaline, or contains an surfactant.

For example, when the hard mask HM is formed from $Al_2O_3$, if the pH of the polishing liquid represents nearly neutral, the pH thereof is similar to the pH of the isoelectric point of the zeta-potential of $Al_2O_3$. Thus, the dust DS due to polishing may be attached to the hard mask HM again. Therefore, when silica particles generally used as polishing particles are used, the silica particles may be controlled so that the pH thereof is an alkali level of about 8 to 12. If the pH thereof is less than 8, the pH is similar to the pH of the isoelectric point of the silica particles. Thus, there is concern that the polishing surface may be scratched or the particles may be unstably dispersed due to particle agglutination. On the other hand, if the pH is larger than 12, the silica particles may dissolve. When alumina particles or ceria particles of which the isoelectric points of the zeta-potentials are nearly neutral are used as polishing particle, the pH thereof represents acid or alkaline.

Polishing liquid used in chemical-mechanical polishing of a superficial layer of the hard mask HM may contain resin particles. If the polishing liquid contains resin particles, scraping of the hard mask HM or formation of scratch thereon can be prevented. Further, resin particles remaining on the hard mask HM can be readily removed by dry etching. For example, the resin particles may be polystyrene particles.

If the polishing liquid contains an surfactant, the surfactant should increase the absolute value of the zeta-potential of the polishing liquid. As such surfactant, an surfactant similar to the surfactant used in performing scrub cleaning on the surface of the hard mask HM may be used.

Figure 5:
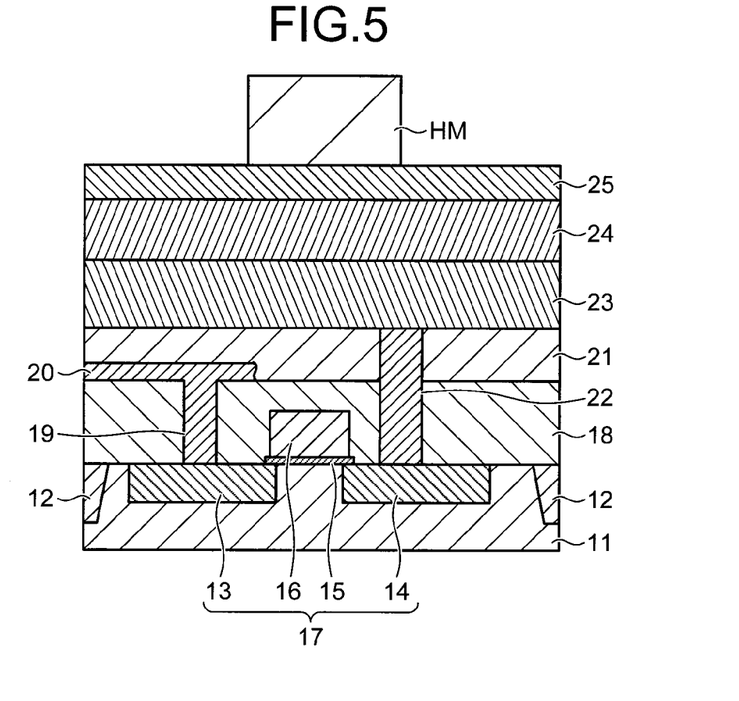
FIG. 5 is still another sectional view for showing the fabricating method of the nonvolatile semiconductor storage apparatus according to the embodiment shown in FIG. 1.
Figure 6:
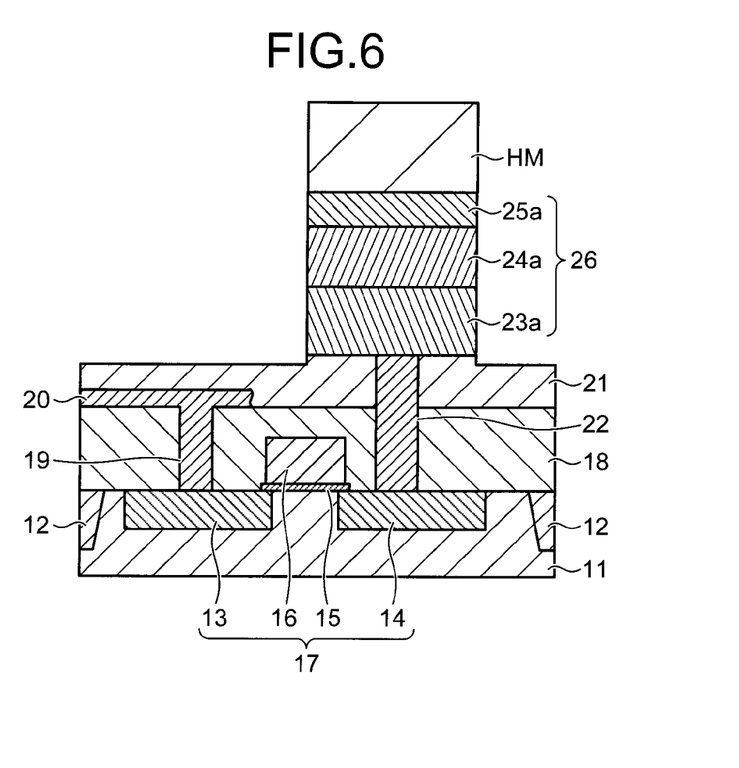
FIG. 6 is still another sectional view for showing the fabricating method of the nonvolatile semiconductor storage apparatus according to the embodiment shown in FIG. 1.

As shown in FIG. 5, the hard mask HM is patterned according to the planar shape of a ferroelectric capacitor 26 shown in FIG. 6 by employing photolithography and etching.

By patterning the hard mask HM after reducing the dust DS on the hard mask HM, shape defect of the hard mask HM can be reduced and patterning accuracy of the hard mask HM can be improved.

As shown in FIG. 6, anisotropic etching is sequentially performed on the electrode film 25, the ferroelectric film 24, and the electrode film 23 by using the patterned hard mask HM as a mask. Thus, a top electrode 25a, a ferroelectric layer 24a, and a bottom electrode 23a are formed, thereby forming on the semiconductor substrate 11 a ferroelectric capacitor 26 of which the bottom electrode 23a is connected to the impurity introduction layer 14 via the plug electrode 22.

The bottom electrode 23a and the top electrode 25a may be formed of material such as a Pt electrode, an oxide electrode such as $RuO_2$, and an Ir electrode such as Ir and $IrO_2$, or combination thereof. More particularly, the bottom electrode 23a preferably has TiAlN/Ir structure and the top electrode 25a preferably has IrO2/SrRuO3 structure. The ferroelectric layer 24a is preferably formed of, for example, lead oxide ferroelectric substance such as PZT or bithmuth layered structured ferroelectric substance such as SBT.

When anisotropic etching is performed on the electrode 25, the ferroelectric film 24, and the electrode film 23, the dust DS on the patterned hard mask HM is first reduced and then, the patterned hard mask HM is used as a mask. Thus, the shape defect of the ferroelectric layer 24a and of the bottom electrode 23a can be reduced and the fabrication yield can be improved.

Figure 7:
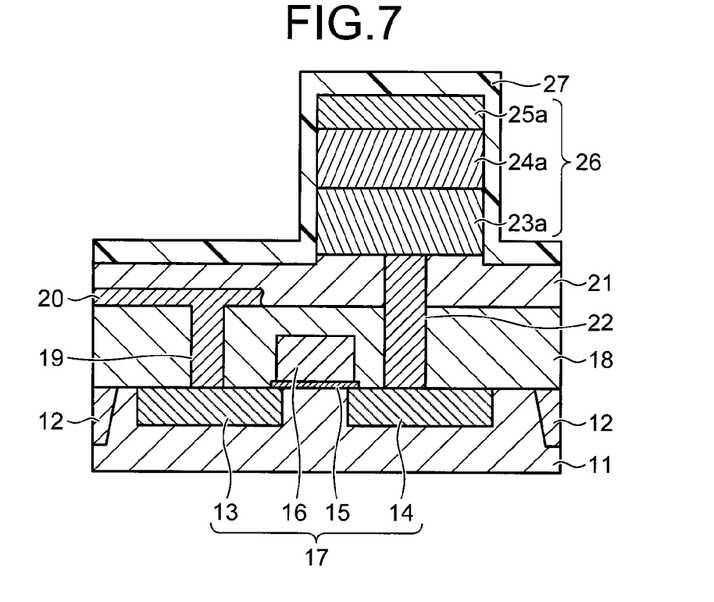
FIG. 7 is still another sectional view for showing the fabricating method of the nonvolatile semiconductor storage apparatus according to the embodiment shown in FIG. 1.

After removing the hard mask HM, a hydrogen barrier film 27 is formed on the interlayer insulating film 21 as shown in FIG. 7 by employing a method such as sputtering so that the exposed surfaces of the top electrode 25a, the ferroelectric layer 24a, and the bottom electrode 23a are covered by the hydrogen barrier film 27. The hydrogen barrier film 27 may be formed of $Al_2O_3$. The film thickness of the hydrogen barrier film 27 may be set to be about 50 to 100 nanometers from the viewpoint of hydrogen barrier property of the hydrogen barrier film 27.

Figure 8:
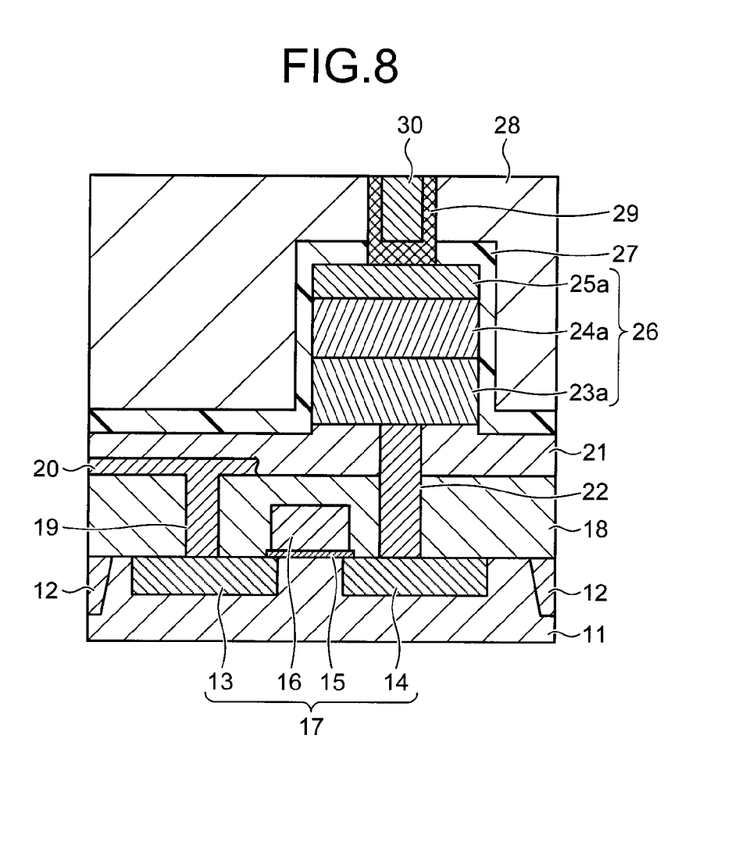
FIG. 8 is still another sectional view for showing the fabricating method of the nonvolatile semiconductor storage apparatus according to the embodiment shown in FIG. 1.

As shown in FIG. 8, an interlayer insulating film 28 is formed on the hydrogen barrier film 27 by employing a method such as CVD. An opening that exposes the top electrode 25a is formed through the interlayer insulating film 28 and the hydrogen barrier film 27 by employing photolithography and etching. Then, a barrier metal film 29 and a conductive material film are sequentially formed on the interlayer insulating film 28 through which the opening is formed, and the barrier metal film 29 and the conductive material film are removed by employing CMP. Thus, a plug electrode 30 connected to the top electrode 25a via the barrier metal film 29 is formed through the hydrogen barrier film 27 and the interlayer insulating film 28. The barrier metal film 29 may be formed of material such as TiN, and the plug electrode 30 may be formed of material such as tungsten.

Figure 9:
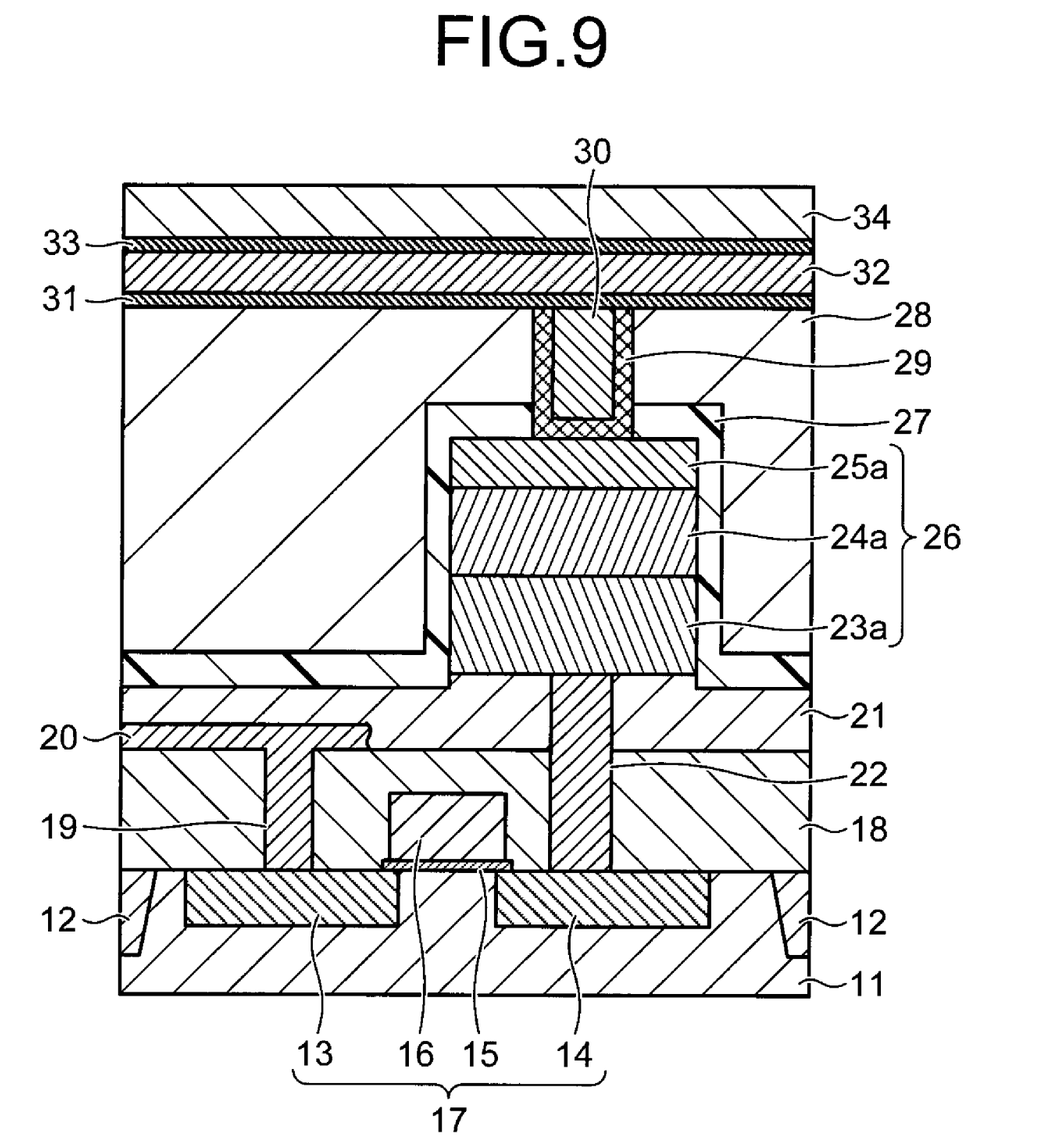
FIG. 9 is still another sectional view for showing the fabricating method of the nonvolatile semiconductor storage apparatus according to the embodiment shown in FIG. 1.

As shown in FIG. 9, a common line 32 is formed on the interlayer insulating film 28 so that the upper and lower surfaces of the common line 32 are sandwiched between the barrier metal films 31 and 33, and an insulating film 34 is formed on the barrier metal film 33. The barrier metal films 31 and 33 may be formed of material such as TiN, and the common line 32 may be formed of material such as Al.

Figure 10A:
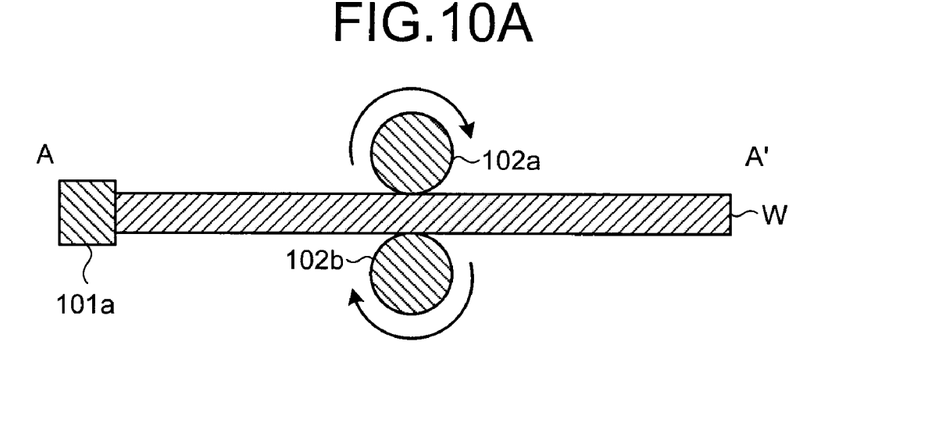
FIG. 10A is a sectional view of a general configuration of a cleaning device used in a fabricating method of a nonvolatile semiconductor storage apparatus according to an embodiment of the present invention.
Figure 10B:
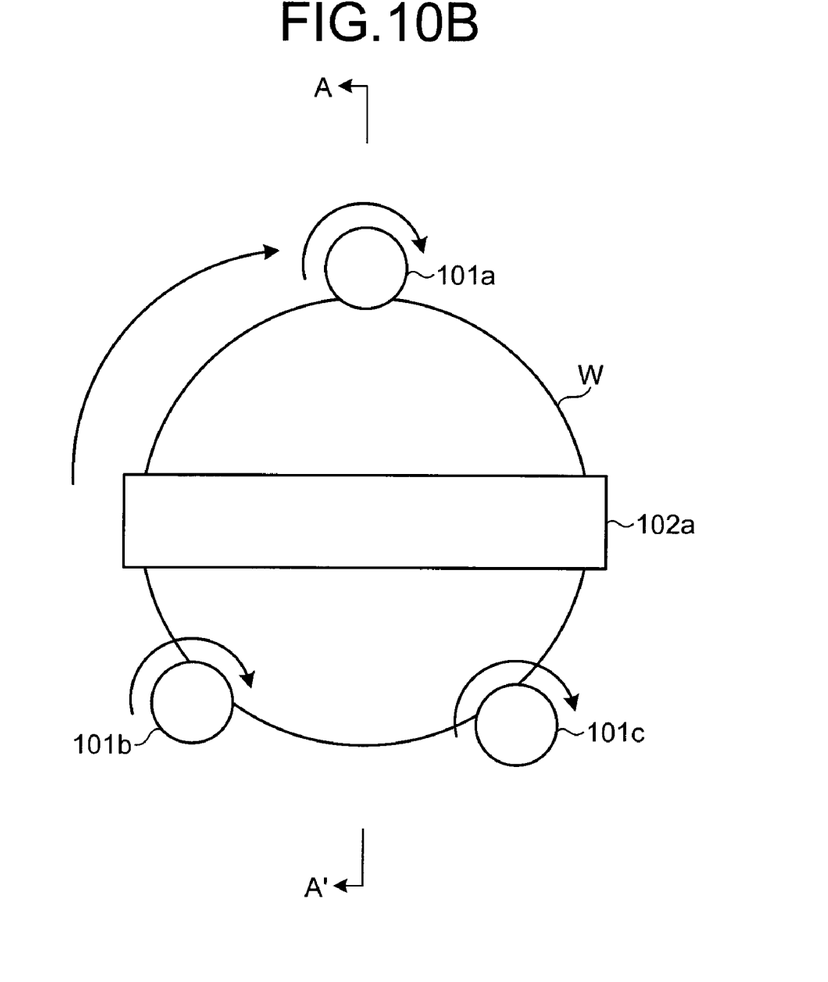
FIG. 10B is a plan view of the general configuration of the cleaning device shown in FIG. 10A.

FIG. 10A is a sectional view of a general configuration of a cleaning device used in a fabricating method of a nonvolatile semiconductor storage apparatus according to an embodiment of the present invention, and FIG. 10B is a plan view of the general configuration of the cleaning device.

In FIGS. 10A and 10B, the cleaning device includes rollers 101a to 101c that rotate a wafer W in a horizontal plane while holding the wafer W on the circumference thereof and cleaning rollers 102a and 102b that perform scrub cleaning on the wafer W. The cleaning rollers 102a and 102b may be formed, for example, of poly-vinyl alcohol (PVA) sponge.

The wafer W on which the hard mask HM shown in FIG. 3 is formed is placed between the cleaning rollers 102a and 102b. The hard mask HM is cleaned by rotating the cleaning rollers 102a and 102b in which an surfactant is perfused while rotating the wafer W in a horizontal plane, and thus, the dust DS on the hard mask HM can be removed.

An anionic surfactant is preferably used as the surfactant. For example, ammonium polycarboxylate having a concentration of 0.01 to 1 wt % can be used as the anionic surfactant.

Dust is generated also when the electrode film 23 shown in FIG. 2 is formed or when the electrode film 25 shown in FIG. 2 is formed. Therefore, in addition to performing scrub cleaning on the hard mask HM shown in FIG. 3, scrub cleaning may be performed on the electrode film 23 after formation of the electrode film 23 shown in FIG. 2, or on the electrode film 25 after formation of the electrode film 25 shown in FIG. 2.

Figure 11:
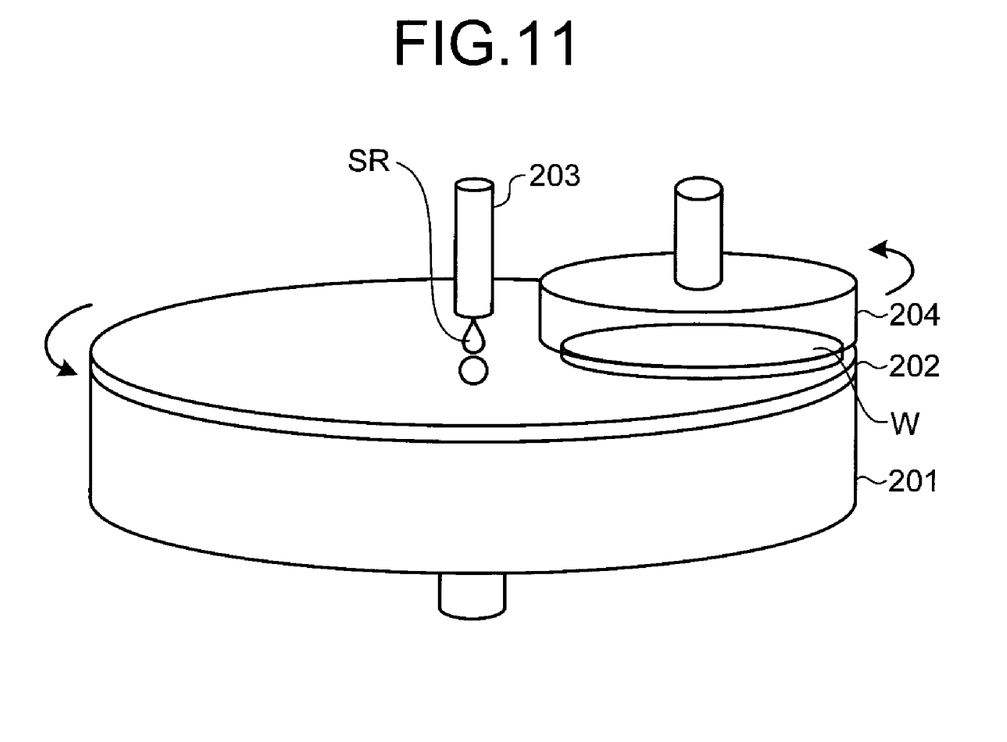
FIG. 11 is a perspective view of a general configuration of a polishing device used in a fabricating method of a nonvolatile semiconductor storage apparatus according to an embodiment of the present invention.

FIG. 11 is a perspective view of a general configuration of a polishing device used in a fabricating method of a nonvolatile semiconductor storage apparatus according to an embodiment of the present invention.

In FIG. 11, the polishing device includes a revolving table 201 that rotates, a nozzle 203 that supplies polishing liquid SR on the revolving table 201, a carrier 204 that rotates and presses the wafer W against the revolving table 201. Polishing cloth 202 is applied on a surface of the revolving table 201. The pH of the polishing liquid SR is preferably controlled to represent acid or alkaline. The polishing liquid SR may also contain an surfactant.

The wafer W on which the hard mask HM shown in FIG. 3 is formed is placed on the carrier 204. The nozzle 203 supplies the polishing liquid SR on the polishing cloth 202, and the revolving table 201 and the carrier 204 rotates while the wafer W is pressed against the polishing cloth 202 via the carrier 204. Thus, a superficial layer of the hard mask HM can be polished and the dust DS on the hard mask HM can be removed.

Figure 12:
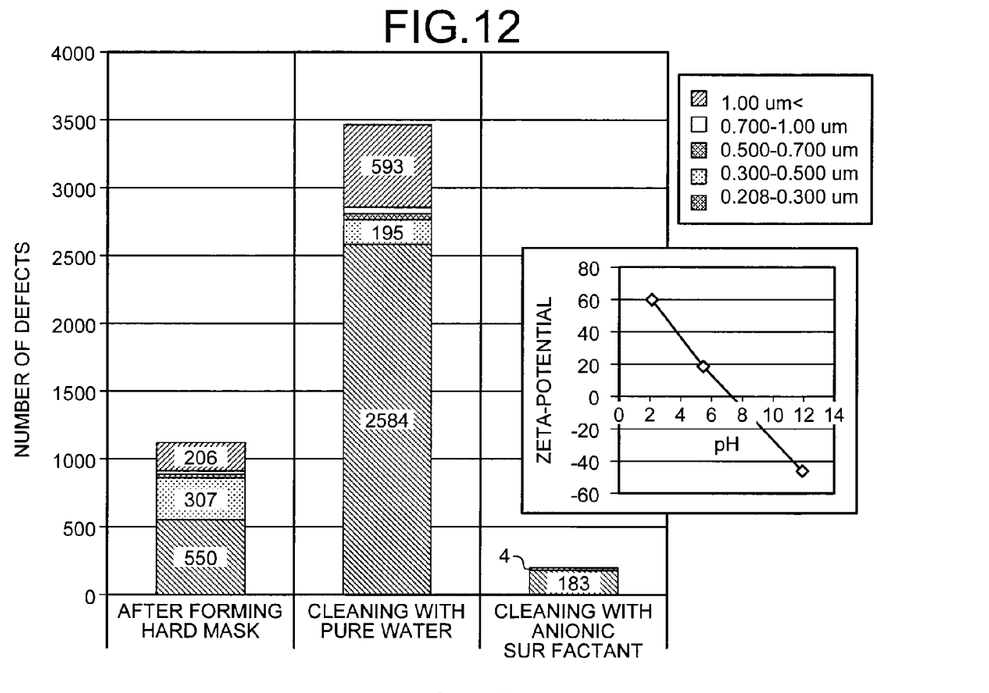
FIG. 12 is a graph of the number of defects on a hard mask used in a fabricating method of a nonvolatile semiconductor storage apparatus according to an embodiment of the present invention along with a comparative example.

FIG. 12 is a graph of the number of defects on a hard mask used in a fabricating method of a nonvolatile semiconductor storage apparatus according to an embodiment of the present invention along with a comparative example.

In FIG. 12, a PZT film is formed as the ferroelectric film 24 shown in FIG. 2, and then a stacked film of a $SrRuO_3$ film and an $IrO_2$ film is formed as the electrode film 25. An $Al_2O_3$ film having a film thickness of about 130 nanometers is formed on the electrode film 25 as the hard mask HM. Here, on the hard mask HM, about 1000 pieces of the dust DS are generated on a wafer. The size of the dust DS is about a fraction of a micrometer, and the size of some particles is larger than 1 micrometer.

The wafer W is placed on the cleaning device shown in FIG. 10, and is rotated at 100 rpm via the rollers 101a to 101c. The cleaning rollers 102a and 102b are rotated at 100 rpm as being in contact with the upper and the lower surfaces of the wafer W, while being supplied with only 500 milliliters of an aqueous solution of ammonium polycarboxylate having the concentration of 0.2 wt %. The upper and the lower surfaces of the wafer W are cleaned only for 60 seconds, and then, spin-dry is performed thereon. As a result, the number of dust DS on the hard mask HM is reduced to about 200.

On the other hand, if similar cleaning is performed thereon with pure water in stead of with an aqueous solution of ammonium polycarboxylate, the number of the dust DS on the hard mask HM is increased to about 3500. The dust DS is induced to be reattached when pure water that the pH thereof represents neutral is used because the pH of the isoelectric point of the zeta-potential of $Al_2O_3$ is nearly neutral.

Figure 13:
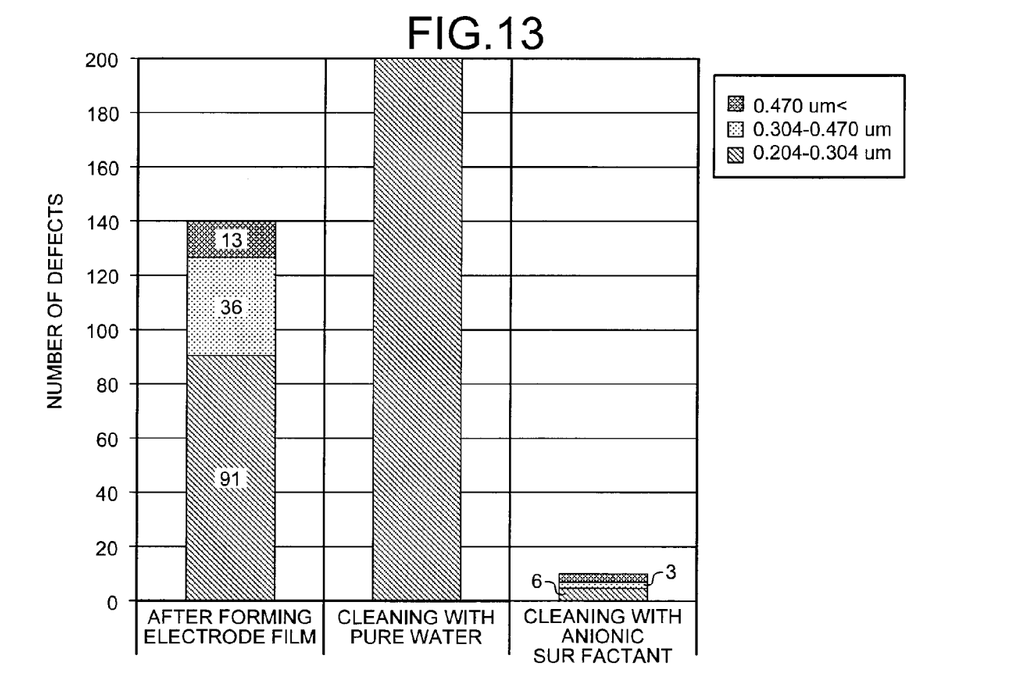
FIG. 13 is a graph of the number of defects on a bottom electrode of a nonvolatile semiconductor storage apparatus according to an embodiment of the present invention along with a comparative example.

FIG. 13 is a graph of the number of defects on a bottom electrode of a nonvolatile semiconductor storage apparatus according to an embodiment of the present invention along with a comparative example.

In FIG. 13, a TiAlN film is formed as the electrode film 23 shown in FIG. 2. Here, on the electrode film 23, about 140 pieces of the dust DS are generated on a wafer.

The wafer W is placed on the cleaning device shown in FIG. 10, and then, the wafer W is rotated via the rollers 101a to 101c at 100 rpm. The cleaning rollers 102a and 102b are rotated at 100 rpm as being in contact with the upper and the lower surfaces of the wafer W, while being supplied with only 500 milliliters of an aqueous solution of ammonium polycarboxylate having the concentration of 0.2 wt %. The upper and the lower surfaces of the wafer W are cleaned only for 60 seconds, and then, spin-dry is performed thereon. As a result, the number of the dust DS on the electrode film 23 is reduced to about 10.

On the other hand, if similar cleaning is performed with pure water in stead of with aqueous solution of an ammonium polycarboxylate, the number of dust DS on the electrode film 23 is increased to more than 200.

Figure 14:
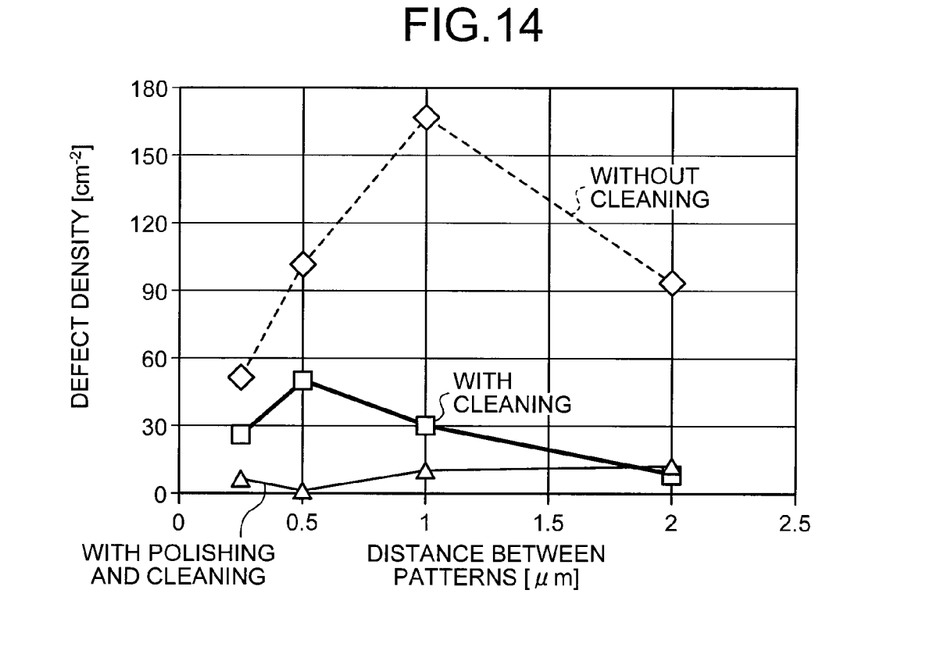
FIG. 14 is a graph of defect densities on a ferroelectric capacitor fabricated according to a fabricating method of a nonvolatile semiconductor storage apparatus according to an embodiment of the present invention as a distance between patterns changes.

FIG. 14 is a graph of defect densities on a ferroelectric capacitor fabricated according to a fabricating method of a nonvolatile semiconductor storage apparatus according to an embodiment of the present invention as a distance between patterns fluctuates. More particularly, electrode interconnection yield is measured with respect to space between electrodes, and then, defect densities are calculated based thereon.

In FIG. 14, if an $Al_2O_3$ film is used as the hard mask HM shown in FIG. 3, a defect density fluctuates according to distance between patterns, and the density is highest when the distance between patterns is about 1 micrometer. If an anionic surfactant is used to perform scrub cleaning on the $Al_2O_3$ film, a defect density can be reduced. By polishing the $Al_2O_3$ film by employing CMP in addition to performing scrub cleaning, a defect density can further be reduced.

Figure 15:
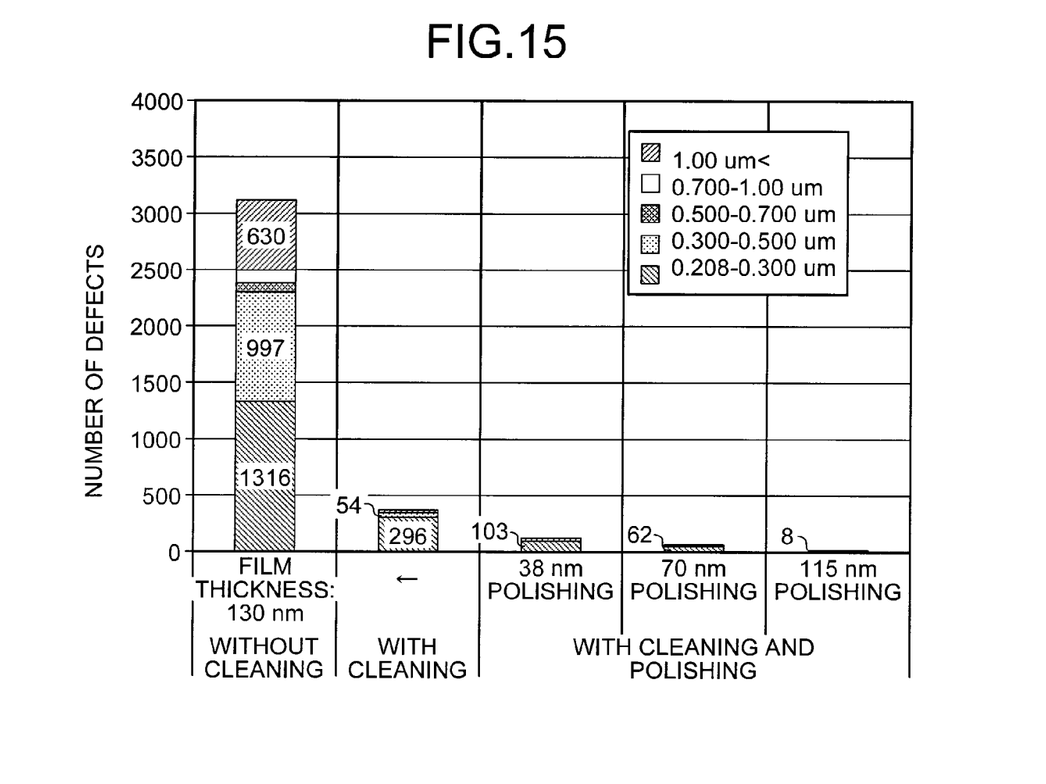
FIG. 15 is a graph of the number of defects on a hard mask used in a fabricating method of a nonvolatile semiconductor storage apparatus according to an embodiment of the present invention in cases of without cleaning, with cleaning, and with polishing and cleaning.

FIG. 15 is a graph of the number of defects on a hard mask used in a fabricating method of a nonvolatile semiconductor storage apparatus according to an embodiment of the present invention in cases of without cleaning, with cleaning, and with polishing and cleaning.

In FIG. 15, a PZT film is formed as the ferroelectric film 24 shown in FIG. 2, and then, a stacked film of a $SrRuO_3$ film and an $IrO_2$ film is formed as the electrode film 25. An $Al_2O_3$ film having a film thickness of about 130 nanometers is formed on the electrode film 25 as the hard mask HM shown in FIG. 3. Here, in the hard mask HM, about 3000 pieces of the dust DS are generated on a wafer.

Then, scrub cleaning is performed on the hard mask HM with an aqueous solution of an anionic surfactant (for example, TK75 manufactured by Kao Corporation). As a result, on the hard mask HM, the number of dust on a wafer is reduced to about 300, i.e., to about one tenth of the original amount.

On the other hand, if similar cleaning is performed thereon with pure water instead of with an aqueous solution of an anionic surfactant, the number of dust DS on the hard mask HM is increased to about 6000.

The wafer W on which the hard mask HM shown in FIG. 3 is formed is placed on the polishing device shown in FIG. 11 (for example, EPO-222 manufactured by Ebara Corporation). Here, liquid containing silica particles having a pH of about 10 (for example, WTS-51 or WTS-52 manufactured by Hirota Chemical Industry Co., Ltd) is used as the polishing liquid SR shown in FIG. 11. POLITEX manufactured by Nitta Haas Incorporated is used as the polishing cloth 202. When the hard mask HM is polished only by 38 nanometers by using the polishing device and scrub cleaning is performed thereon with an anionic surfactant, the number of dust DS is reduced to about 100. By increasing the amount of polishing from 38 nanometers to 70 nanometers and to 115 nanometers, the dust DS embedded in the hard mask HM can also be removed, further reducing the number of the dust DS.

The hard mask HM is polished with liquid that contains an anionic surfactant instead of silica particles (for example, TK75 manufactured by Kao Corporation) as the polishing liquid SR. As a result, the number of dust DS on the hard mask HM is reduced to about 200. Here, when an anionic surfactant is used as the polishing liquid SR, reduction of the film thickness of the hard mask HM can be prevented while reducing the number of dust DS thereon.

The hard mask HM is polished with liquid that contains resin particles instead of silica particles having a pH of about 4 (for example, polystyrene particles having an average particle diameter of 150 nanometers: RST101 manufactured by JSR). As a result, the number of the dust DS on the hard mask HM is reduced to about 80. If liquid that contains resin particles is used as the polishing liquid SR, scraping of the hard mask HM or formation of scratch thereon can be prevented. At the same time, even if resin particles remain on the hard mask HM, the resin particles can be readily removed by dry etching.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A fabricating method of a nonvolatile semiconductor storage apparatus, the fabricating method comprising:
   accumulating a first electrode film, a ferroelectric film, and a second electrode film above a semiconductor substrate in this order;
   performing scrub cleaning on at least one of the first electrode film and the second electrode film with a surfactant;
   accumulating a hard mask above the second electrode film;
   performing scrub cleaning on a surface of the hard mask with a surfactant;
   patterning the hard mask on which scrub cleaning has been performed according to a planar shape of a ferroelectric capacitor; and
   forming the ferroelectric capacitor by performing etching by using as a mask the hard mask that has been patterned.

2. A fabricating method of a nonvolatile semiconductor storage apparatus, the fabricating method comprising:
   accumulating a first electrode film, a ferroelectric film, and a second ferroelectric film above a semiconductor substrate in this order;
   accumulating a hard mask above the second electrode film;
   removing a superficial layer of the hard mask by employing chemical-mechanical polishing;
   patterning the hard mask on which the chemical-mechanical polishing has been performed according to a planar shape of a ferroelectric capacitor; and
   forming the ferroelectric capacitor by performing etching by using as a mask the hard mask that has been patterned.

3. The fabricating method of a nonvolatile semiconductor storage apparatus according to claim 2, the fabricating method further comprising:
   removing the hard mask after forming the ferroelectric capacitor; and
   forming a hydrogen barrier film that covers the ferroelectric capacitor after removing the hard mask.

4. The fabricating method of a nonvolatile semiconductor storage apparatus according to claim 2, the fabricating method further comprising performing scrub cleaning on at least one of the first electrode film and the second electrode film with a surfactant.

5. The fabricating method of a nonvolatile semiconductor storage apparatus according to claim 2, wherein the hard mask is formed of aluminum oxide.

6. The fabricating method of a nonvolatile semiconductor storage apparatus according to claim 2, wherein the first electrode film is formed of TiAlN/Ir structure and the second electrode film is formed of $IrO_2/SrRuO_3$ structure.

7. The fabricating method of a nonvolatile semiconductor storage apparatus according to claim 2, wherein polishing liquid used in the chemical-mechanical polishing contains a surfactant.

8. The fabricating method of a nonvolatile semiconductor storage apparatus according to claim 7, wherein the surfactant is an anionic surfactant.

9. The fabricating method of a nonvolatile semiconductor storage apparatus according to claim 8, wherein the anionic surfactant is an aqueous solution of ammonium polycarboxylate.

10. The fabricating method of a nonvolatile semiconductor storage apparatus according to claim 2, wherein polishing liquid used in the chemical-mechanical polishing has pH representing acid or alkaline.

11. The fabricating method of a nonvolatile semiconductor storage apparatus according to claim 2, wherein polishing liquid used in the chemical-mechanical polishing contains resin particles.

12. The fabricating method of a nonvolatile semiconductor storage apparatus according to claim 11, wherein the resin particles are polystyrene particles.

13. The fabricating method of a nonvolatile semiconductor storage apparatus according to claim 2, the fabricating method further comprising performing scrub cleaning on a surface of the hard mask with a surfactant, wherein the hard mask on which the scrub cleaning has been performed is patterned according to the planar shape of the ferroelectric capacitor.

14. The fabricating method of a nonvolatile semiconductor storage apparatus according to claim 13, wherein the surfactant is an anionic surfactant.

* * * * *